United States Patent [19]

Valfre

[11] 4,017,770

[45] Apr. 12, 1977

[54] CONNECTING DEVICE FOR TELECOMMUNICATION CIRCUITS

[75] Inventor: Cesare Valfré, Turin, Italy

[73] Assignee: Applicazione Elettrotelefoniche SpA, Turin, Italy

[22] Filed: Nov. 22, 1974

[21] Appl. No.: 526,317

[52] U.S. Cl. .................... 361/399; 339/176 MP; 361/421
[51] Int. Cl.² ........................................ H02B 1/02
[58] Field of Search ...... 317/101 DH; 339/176 MP, 339/17 LM, 17 LC, 65; 324/158 F, 73 PC; 179/98

[56] References Cited

UNITED STATES PATENTS

| | | |
|---|---|---|
| 2,731,609 | 1/1956 | Sobel .......................... 317/101 DH |
| 3,418,534 | 12/1968 | Koons et al. ................. 317/101 DH |
| 3,576,515 | 4/1971 | Frantz .......................... 317/101 DH |
| 3,609,547 | 9/1971 | Slusser .......................... 324/158 F |

Primary Examiner—David Smith, Jr.

[57] ABSTRACT

Connecting device for telecommunication circuits, comprising a frame of insulating material shaped as a rectangle and having guiding grooves which may engage the edges of a movable board, carrying printed circuits and electric and/or electronic components so as to form a circuitry apt to process the signals arriving to the device.

6 Claims, 4 Drawing Figures

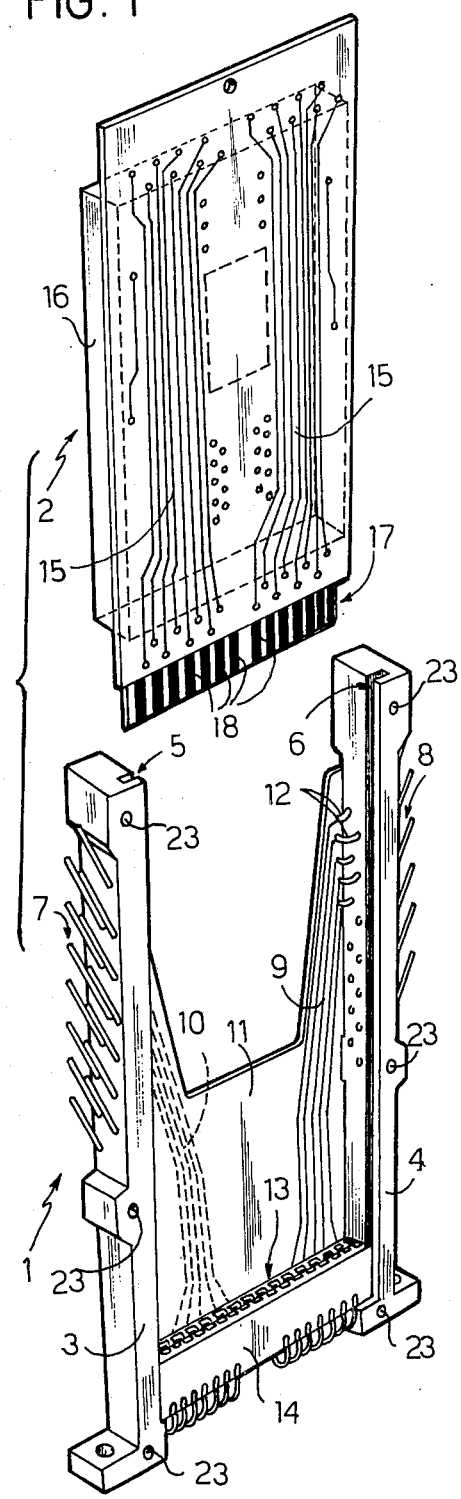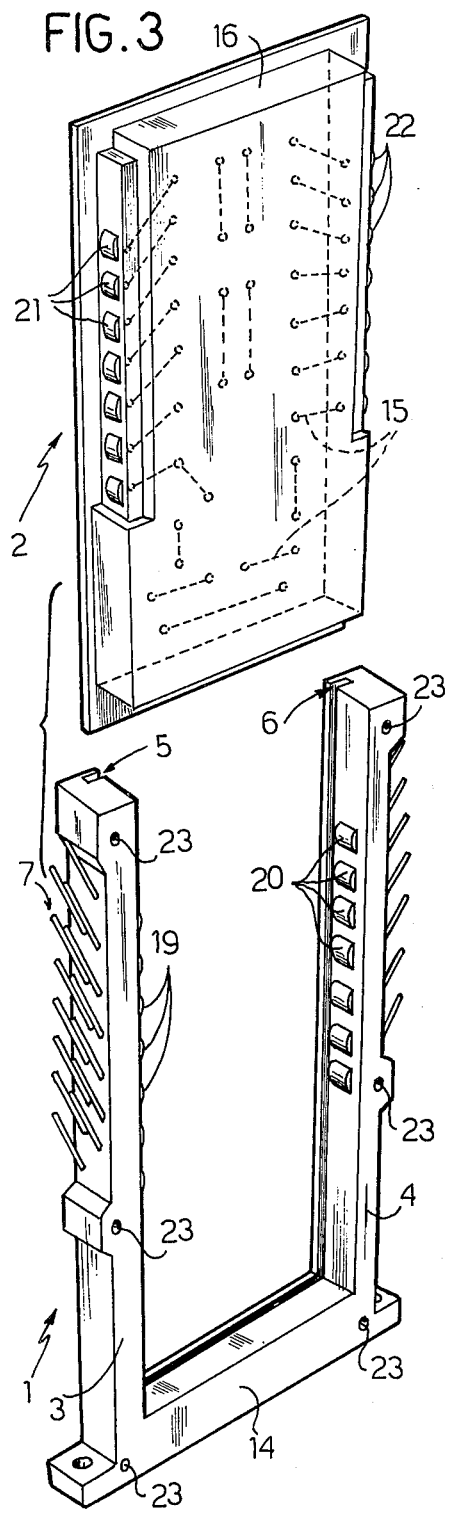

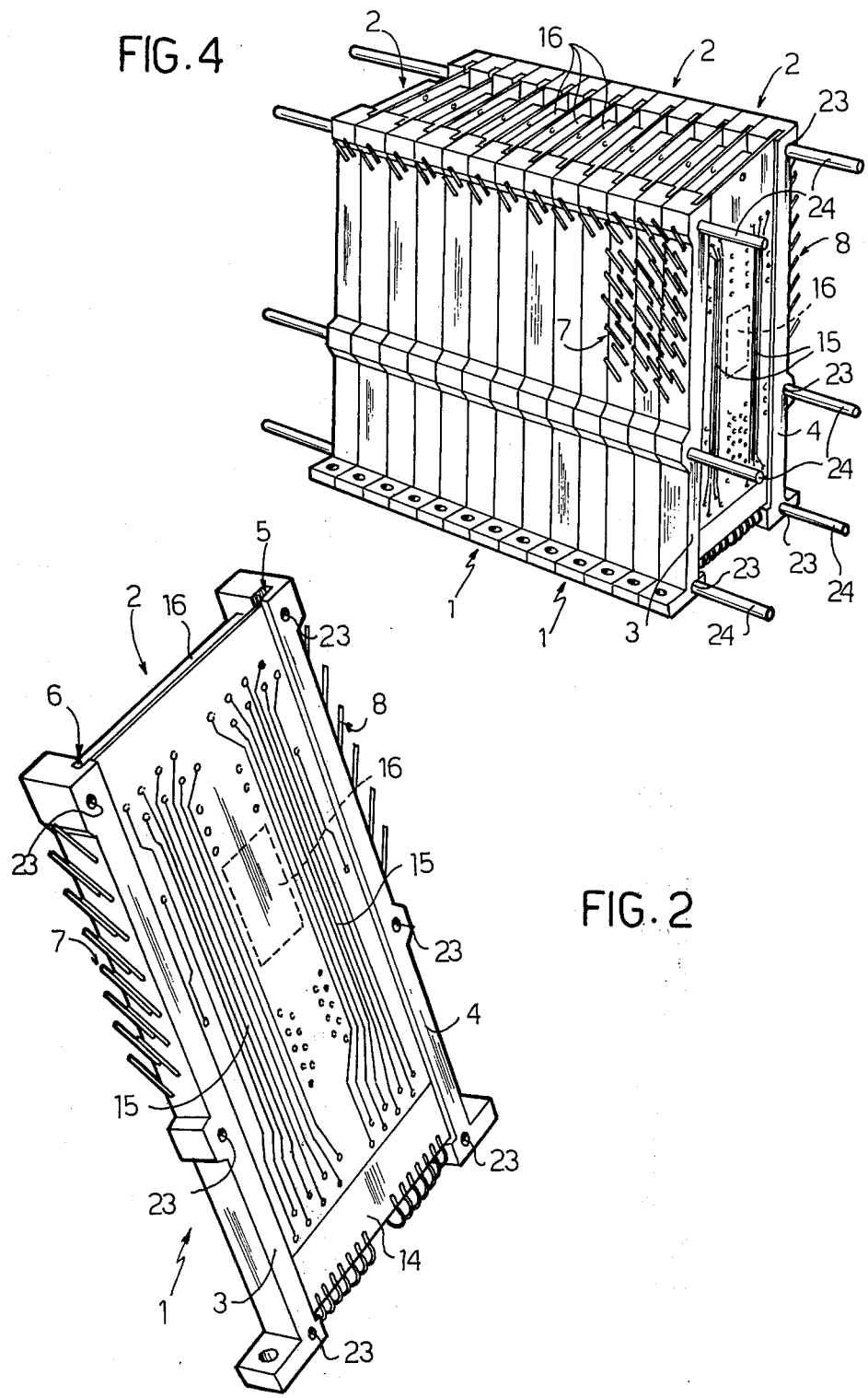

CONNECTING DEVICE FOR TELECOMMUNICATION CIRCUITS

FIELD OF THE INVENTION

The present invention relates to a connecting device for telecommunication circuits.

PRIOR ART

It is known that in the practical operation of telecommunication systems, the signals existing on the circuits, in order to be correctly employed, must undergo to suitable treatments or processings, such as amplifications, attenuations, equalizations, controls, protections, decodings and so on, which operations are realized by means of suitable electric and/or electronic components.

BRIEF SUMMARY OF THE INVENTION

The object of the invention is to provide a device which allows to connect input circuits with output circuits through one or more circuitries apt to carry out one or more of the said processings.

Hereinafter the term "input" will be used to denote the circuit(s) carrying the signals to be processed, and the term "output" to denote the circuit(s) carrying the already processed signals.

The device according to the invention is characterized in that it substantially comprises a threeside frame, made of an insulating material and advantageously shaped as a rectangle open in correspondence of one side, which frame is provided, on an outwardly directed wall of each of the two opposite sides, input or respectively output terminals, and has on the inner face of each of the said sides a longitudinal groove, which may be engaged by two opposite edges of a movable board, which board has shape and size substantially corresponding with the shape and size of the hollow space encircled by the frame, the said board having printed thereon circuits in which elements apt to process the signals arriving at the input terminals may be connected, said frame being provided with input and output connectors, connected to the corresponding terminals and apt to cooperate with conjugate connectors carried by the board and electrically connected to the circuits thereof, in order electrically, to connect the said input terminals with the said output terminals through the processing circuits carried by the said board.

According to a first embodiment of the invention, the said opposite sides of the frame are mechanically connected by a fixed board, having printed thereon leads to which are connected the input or respectively output terminals. Advantageously the said terminals have one end projecting from the inner face of the said sides of the frame and are suitably connected to one end of the leads of the printed circuit of the fixed board, which through the said leads electrically connects the said terminals and those of a connector located on the fixed board in front of the frame opening and possibly corresponding to the closing side of the frame.

According to a second embodiment, the connectors on the frame consist of areas of conductive material realized on the inner face of each of the two opposite sides of the frame, and suitably connected to the input or respectively output terminals, and the movable board is provided, on the edges engaging the said grooves, with contact springs which, when the board is inserted in the frame, provide for the desired connection between input and output through the circuits carried by the board.

Advantageously the device according to the invention may be coupled to a plurality of other similar devices; to this end the two major sides of the frame are provided with through holes, with axis perpendicular to the plane of the movable board, and which may be engaged by suitable rods apt to support the said plurality of devices.

THE DRAWINGS

The invention will appear more clearly from the following description, taken in conjunction with the accompanying drawings which show some embodiments of the invention given by way of non limitative examples, and in which:

FIG. 1 is a perspective view of a first embodiment of the device according to the invention, with the movable board extracted;

FIG. 2 is a perspective view of the device of FIG. 1, with the movable board inserted in the frame;

FIG. 3 is a view similar to FIG. 1 and shows a second embodiment of the invention; and FIG. 4 is a perspective view of a group of devices according to the invention.

DETAILED DESCRIPTION OF THE INVENTION

Referring to FIGS. 1 and 2 of the drawings, the device according to the invention comprises a frame 1 of insulating material, advantageously of rectangular shape without one of the minor sides and upwardly open, which frame has on the inwardly directed surface of its major sides 3 and 4, guiding grooves 5 or respectively 6 which may be engaged by two edges of a movable board 2, which will be described later on.

The outer surface of each of the two major sides 3 and 4 has fixed thereon input and respectively output terminals 7, 8, an end portion of which is embedded in the insulating material of the sides and projects from the inner surface thereof permitting to connect electrically, the terminals with printed circuits 9, 10 realized on a fixed board 11 solid with the frame 11. Only the projecting and portions 12 of terminals 8 are shown in the drawing.

The printed circuits 9, 10 of plate 11 are also connected to contacts 13 located on the two faces of a groove realized in a connector 14 which may form the third side of frame 1.

The board 2 has on its faces printed circuits 15 to which devices apt to process the signals arriving to the input terminals 7 may be connected: these devices are diagrammatically shown by the parallelepiped 16.

FIG. 1 still shows that the board 2 has a bottom edge 17 having realized thereon contacts 18 conjugate with contacts 13 of connector 14: the said edge 17, in the operating position of the device (FIG. 2) engages the groove of connector 14, so that contacts 13 and 18, together with circuits 9, 10, 15 and the projecting ends 12 of the terminals, cooperate in order electrically to connect the input 7 with the output 8 through the processing devices 16 carried by the plate 2.

The drawing still shows that the terminals 7, 8 are fastened to the respective frame side at an acute angle therewith: this has the aim to make easier the assembling and the connection of the device in the telecommunication circuits, and has no limitative character for the invention.

In the embodiment of FIG. 3, the device according to the invention still comprises the rectangular frame 1 with three sides, provided on the major sides 3, 4 with the guides 5, 6 for the plate 2 and with the input and output terminals 7, 8.

In this embodiment the terminals 7, 8 have on the inner face of the sides 3, 4 of frame 1 contact areas 19 and respectively 20, and the edges of plate 2 are provided with contact springs 21, 22 connected to the printed circuit 15. The distance between adjacent springs coincides with the distance between adjacent contacts 19 or 20 on the frame 1, and the said springs cooperate with the said contacts to realize the desired electrical connection between the terminals 7, 8.

In this embodiment the minor side 14 of the frame 1 acts only as a mechanical link between the major sides 3, 4.

FIGS. 3 and 4 show also that the major sides of frame 1, near their ends and in an intermediate point, are provided with through holes 23 of which the axis is perpendicular to the faces of the frame, said holes allowing to gather together a plurality of devices, as shown in FIG. 4, for instance by means of rods 24 engaging the said holes.

It is self evident that the above description is given only by way of non limitative example and that changes and modifications may be realized, particularly in the shape or the arrangement of the elements, without departing from the scope of the invention.

What I claim is:

1. A connecting device for telecommunication circuits, to allow the transfer of signals from input terminals receiving the signals to be processed to output terminals carrying the processed signals, the said transfer being through circuits suitable to carry out said processing, said connecting device comprising:
   a three-sided frame made of insulating material and shaped as a rectangle open in correspondence of one of the minor sides thereof;
   input and respectively output terminals on one outwardly directed face of two opposite sides of said three-sided frame, said terminals having an end portion thereof embedded in the material of said sides and ending on the inner face thereof;
   guiding grooves on the said inner face of the opposite sides of said three-sided frame;
   a movable board, having edges engaging said grooves and having shape and size such as to be coincident with the shape and size of the frame concavity;
   printed circuits on the faces of said board, for connecting electrical components for processing said input signals;
   input and output connectors connected to said input and output terminals respectively;
   conjugate connectors carried by said board and cooperating with said input and output connectors and electrically connected to the circuits of said board, in order to connect the said input terminals with the said output terminals through the said processing circuits;
   said two opposite sides of said frame are connected by a fixed board provided with a connector and with printed leads which have one end connected to contacts in the connector and the other end connected to the input or respectively output terminals, the said fixed board being parallel to the said movable board.

2. A device according to claim 1, wherein the connector of the said fixed board is located in front of the opening of the said frame and is perpendicular to the opposite sides thereof.

3. A device according to claim 2, wherein the said connector forms the third side of the said frame.

4. A device according to claim 1, wherein the said input and output terminals have, on the inner face of the said opposite frame sides, areas of conductive material; and wherein the movable board is provided on one edge parallel to the said frame sides with contact springs connected to the board circuits and having the same distance as the areas of conductive materials existing on the frame, said areas and springs forming the conjugate contacts in the frame and the board.

5. A device according to claim 1, further comprising coupling means allowing its coupling with a plurality of identical devices.

6. A device according to claim 5, wherein in that the said means comprises through-holes perpendicular to the faces of the device and located in the major sides of the frame, and rods engaging said holes.

* * * * *